United States Patent [19]

Alcorn et al.

[11] Patent Number: 4,618,380

[45] Date of Patent: Oct. 21, 1986

[54] METHOD OF FABRICATING AN IMAGING X-RAY SPECTROMETER

[75] Inventors: George E. Alcorn, Reston, Va.; André S. Burgèss, Forestville, Md.

[73] Assignee: The United States of America as represented by the Administrator of the National Aeronautics and Space Administration, Washington, D.C.

[21] Appl. No.: 745,977

[22] Filed: Jun. 18, 1985

[51] Int. Cl.$^4$ .................. H01L 21/383; H01L 21/385
[52] U.S. Cl. .................................... 148/187; 148/188; 148/189; 148/190; 29/580; 29/591
[58] Field of Search ............... 148/1.5, 188, 189, 190; 29/580, 591

[56] References Cited

U.S. PATENT DOCUMENTS

| | | | |
|---|---|---|---|
| 3,801,884 | 4/1974 | Sequin | 357/24 |
| 3,936,645 | 2/1976 | Iversen | 250/486 |
| 3,958,264 | 5/1976 | Magdo | 357/30 |
| 4,250,385 | 2/1981 | Luderer et al. | 250/363 S |
| 4,377,817 | 3/1983 | Nishizawa et al. | 357/22 |
| 4,472,728 | 9/1984 | Grant et al. | 357/30 |
| 4,589,190 | 5/1986 | Anthony | 29/571 |

Primary Examiner—George T. Ozaki
Attorney, Agent, or Firm—John O. Tresansky; John R. Manning; Sol Sheinbein

[57] ABSTRACT

A process for fabricating an X-ray spectrometer having imaging and energy resolution of X-ray sources. The spectrometer has an array of adjoining rectangularly shaped detector cells formed in a silicon body. The walls of the cells are created by laser drilling holes completely through the silicon body and diffusing n+ phosphorous doping material therethrough. A thermally migrated aluminum electrode is formed centrally through each of the cells.

10 Claims, 12 Drawing Figures

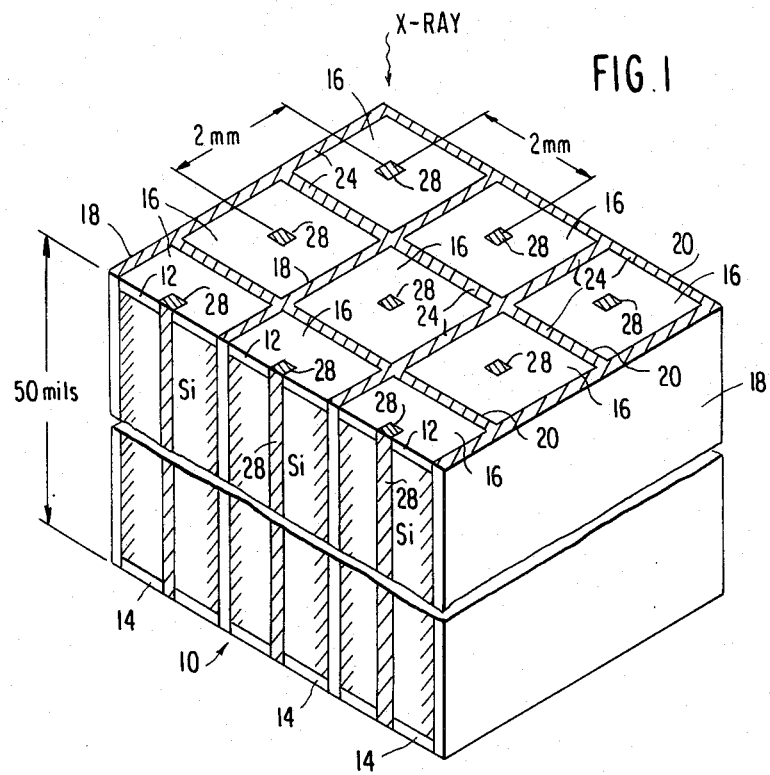
FIG. 1
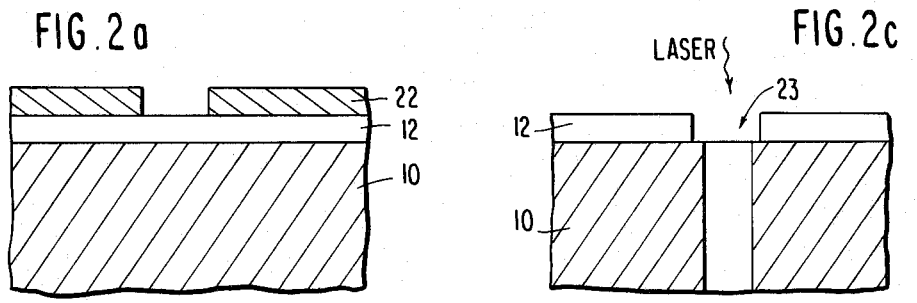
FIG. 2a
FIG. 2c
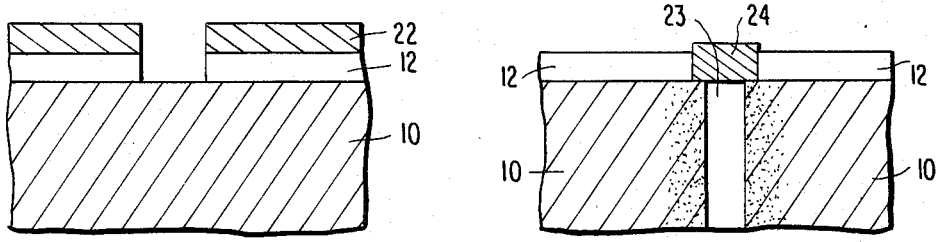
FIG. 2b
FIG. 2d

METHOD OF FABRICATING AN IMAGING X-RAY SPECTROMETER

ORIGIN OF THE INVENTION

The invention described herein was made by employees of the U.S. Government and may be manufactured and used by or for the Government for governmental purposes without the payment of any royalties thereon or therefor.

TECHNICAL FIELD

This invention relates generally to electromagnetic radiation detectors and, more particularly to a process of fabricating a solid state X-ray spectrometer.

BACKGROUND ART

Known instrumentation for providing analysis of electromagnetic radiation X-ray sources typically utilize either silicon charge coupled devices (CCD) or lithium drift detectors. Both of these devices have well recognized shortcomings in their capability to provide imaging and energy resolution of impinging radiation, especially in their ability to detect higher energy X-ray sources.

Recently, an X-ray detector adapted to operate with X-ray sources in the 1 to 30 Kev range has been developed which is capable of providing both high spatial resolution along with good energy resolution. In this device, fully described in U.S. Pat. No. 4,472,728 to Grant et al, a thick silicon body has an embedded matrix, or grid, of aluminum thermally migrated therethrough. The aluminum matrix defines the walls of a rectangular array of X-ray detector cells or pixels. A thermally migrated aluminum electrode is also formed centrally through each of the cells with biasing means being connected to the aluminum cell walls and the centralized aluminum electrode for causing lateral charge carrier depletion between the cell walls so that incident X-ray energy causes a photoelectric reaction within the silicon producing collectible charge carriers in the form of electrons or holes which are collected and used for imaging.

While such detector can perform its intended function, several limitations have been noted in the manner of its fabrication and operation. The walls of the grid defining the pixel must be as thin as possible, i.e., no more than 2 mils in width. Unfortunately, such narrow walls are extremely difficult to drive through a wafer using conventional thermal migration techniques and require long drive-in times to complete. Further, the thermally migrated walls have a tendency to drift randomly off the vertical axis. This is due to a variety of factors including difficulty in migrating certain shapes, crystal imperfections, nonuniform temperatures and wafer position in the thermomigration oven. Attempts to reduce the drive-in times required by thermomigrating points, separated from each other by a mil, rather than continuous lines, resulted in a different problem. A contact metal, such as aluminum, would have to be employed to complete the circuit between the thermomigrated points. If it overlapped the wall boundary, which it invariably do due to the random lateral drift in the wall boundary, the junction of the walls and the substrate would be shorted out therby rendering the device inoperative. Additionally, while it is relatively simple in subsequent processing steps to align the 4-6 mil central electrode, alignment of the thin walls has been found to be quite difficult.

In actual usage of the detector, leakage currents were higher than expected. This has been diagnosed to be transistor action of charge injection due to the arrangement of a p-type aluminum central electrode separated from the p-type aluminum walls by an n-type silicon body, forming a pnp type transistor.

STATEMENT OF INVENTION

Accordingly, it is an object of the present invention to provide a method of fabricating an improved electromagnetic radiation detector.

Another object of the invention is to provide a process of fabricating a detector array adapted to operate with X-ray sources in the 1 to 30 Kev range.

Still another object of the invention is to provide a process enabling accurate formation and alignment of walls in a semiconductor detector array.

Yet another object of the instant invention is to provide a detector fabrication process requiring a relatively small number of individual steps and one which is simple and easy to carry out.

These and other objects are achieved by forming an X-ray detector having an array of discrete, adjoining detector cells, or pixels, created in a thick n-type semiconductor body. The walls defining the cells are formed by laser drilling a plurality of openings in the wafer body and diffusing an n+ doping material therethrough to form the common walls separating adjacent pixels. The process further includes forming an electrode by thermal migrating a p-type metal centrally in each cell and extending it between opposed wafer surfaces.

BRIEF DESCRIPTION OF THE DRAWINGS

The foregoing and other objects, features, and advantages of the invention will become apparent from the following detailed description when taken in conjunction with the accompanying drawings in which like reference symbols indicate the same or similar components throughout the several views, and wherein:

FIG. 1 is a perspective view, partially in section, of an X-ray detector array made according to the invention;

FIGS. 2a through 2d are cross-sectional views of the various stages of fabrication of the wall portion of the detector array.

DETAILED DESCRIPTION OF THE INVENTION

Figure 3A:
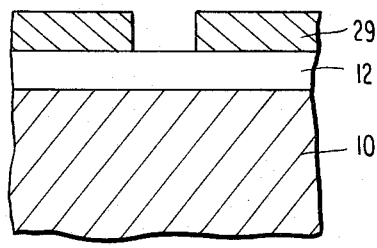
FIGS. 3a through 3g are cross-sectional views of the various stages of fabrication of the central electrode of the detector array.

Referring now to the drawings and, in particular to FIG. 1, an X-ray detector array is formed of a relatively thick body 10 of an electronic grade high resistivity semiconductor material, such as a wafer of silicon. The wafer is lightly doped with phosphorus to exhibit an n-type conductivity with a majority charge carrier concentration of approximately $10^{14}$ carriers per cubic centimeter. The thickness of wafer 10 is made to be slightly greater than the anticipated depth of penetration of incident X-rays to assure photoelectron production by higher energy X-rays. The depth of penetration into a semiconductor material by X-rays perpendicularly incident to the illuminated surface is proportional to the cube of the incident X-ray energy. For X-rays in the 1 to 30 kiloelectron volt range, for example, the thickness of wafer 10 should be on the order of 50 mils. Relatively thin layers 12 and 14, i.e., approximately 2000 Å thick, of silicon dioxide are formed on the upper and lower surfaces, respectively, of wafer 10 by passing steam and oxygen over the surfaces while the wafer is maintained at a temperature of approximately 1000° C.

Silicon wafer 10 is configured into a rectangular grid or matrix of detector cells, or pixels, 16, nine of which are shown, to provide spatial and energy resolution of X-ray images. The grid is formed by vertical walls 18 and 20 which extend completely through the thickness of wafer 10, perpendicularly to its upper and lower surfaces. The pixels 16 are preferably made identical to one another with generally rectangular cross sections across their horizontal surfaces.

Referring now to FIGS. 2a through 2d which sequentially illustrate several steps in the fabrication of the walls 18 and 20, a photoresist mask 22 defining the areas where the walls are to be formed is placed over the upper silicon dioxide layer 12, as shown in FIG. 2a. The silicon dioxide in the exposed areas is removed, as shown in FIG. 2b, by immersing the wafer into a buffered hydrofluoric acid etchant solution. A laser (not shown) is energized to drill circular openings 23 in the exposed areas of wafer 10, as shown in FIG. 2c. Openings 23 are approximately 1 mil in diameter and spaced 2 mils apart and are perpendicular from the top surface completely through the wafer to form discrete circular openings therethrough. Numerous such openings are drilled to form the rectangular cross sections on the upper and lower surfaces. The wafer is then placed into a furnace heated at 1100° C. A mixture of nitrogen and oxygen carrier gas is bubbled through a liquid thermostated bath of POCl$_3$ diffusant dopant source. The diffusant phosphorus gas atoms provided thereby are directed into the furnace. The phosphorus gas dopant, have a uniform concentration of approximately $10^{17}$ cm$^{-3}$ n+ type phosphorus atoms, will diffuse into the silicon wafer through the circular openings 23. The wafer is retained in the furnace for a time sufficient to assure dopant diffusion of n+ phosphorus atoms to a distance of 1 mil from the axis of the opening, thus contacting atoms diffused through openings adjacent thereto, as seen in FIG. 2d. Continuous walls of n+ atoms are thus formed in the silicon wafer using this concentration gradient diffusion technique. Metallic strips 24, preferably aluminum, are then evaporated over the exposed wall areas of the top surface to contact the diffused phosphorus and interconnected to form the configuration shown in FIG. 1. Aluminum strips are likewise evaporated over the openings exposed by the laser drilling in the bottom surface 14 of wafer 10 to contact the diffused phosphorus and interconnected.

Figure 3B:
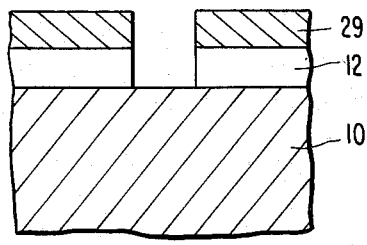
Figure 3C:
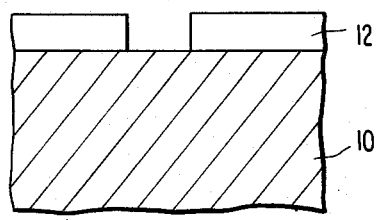
Figure 3D:
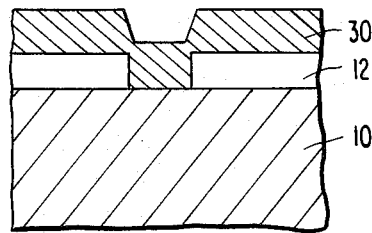
Figure 3E:
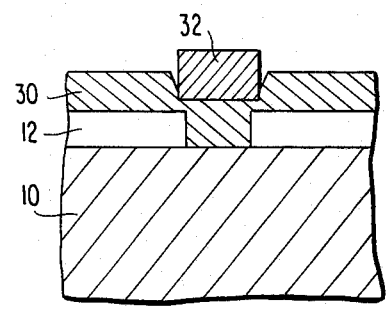
Figure 3F:
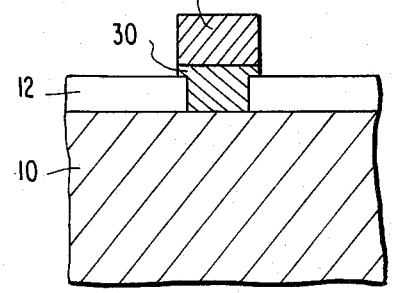
Figure 3G:
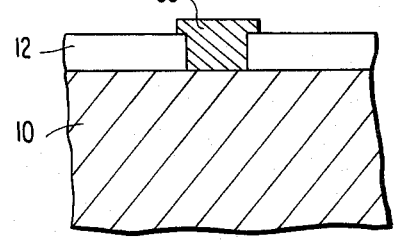

Each pixel 16 has a centrally located diffused metal electrode 28 extending between opposite surfaces and completely through the thickness of wafer 10. Central electrode 28 may be formed by a conventional temperature gradient driven diffusion process of a metal such as aluminum. The specific steps of this process are shown in FIG. 3. Referring to FIG. 3a, a photoresist mask 29 having openings defining the horizontal surface where electrodes 28 are to be formed is placed over the silicon dioxide layer 12. The silicon dioxide in the exposed areas is removed, as shown in FIG. 3b, by immersing the wafer in a hydrofluoric acid. The photoresist is then stripped in hot chromic acid and the wafer rinsed clean, as seen in FIG. 3c. A thin film of a p type metal, such as aluminum 30, is then evaporated over the top surface of the wafer 10, as shown in FIG. 3d. A photoresist mask 32 exposing the aluminum 30 in the areas other than where the electrodes 28 are being formed is then placed over the wafer as shown in FIG. 3e. The exposed aluminum film 30 is thereupon etched with phosphoric acid, as shown in FIG. 3f. Finally, the photoresist is stripped in hot chromic acid and the wafer rinsed clean, as seen in FIG. 3g. The wafer may then be heated in an oven to an elevated temperature on the order of 1150° C. The lower surface is maintained at the chamber temperature while the upper wafer surface may be cooled to a slightly lower temperature such as 1100° C. to establish a thermal gradient across the wafer. The aluminum film 30 deposed in the etched openings on the cooler surface of the heated wafer is quickly driven by the thermal gradient to diffuse vertically completely through the wafer to the opposite surface. The rapid temperature gradient driven diffusion of the metal through the entire thickness of wafer 10 leaves little time for lateral diffusion. Electrodes 28, therefore, are essentially perpendicular to the horizontal surfaces of wafer 10. The cross-sectional dimensions of each electrode 28 is made relatively small compared to the cross-sectional area of pixel 16, thereby minimizing the probability of X-rays impinging directly upon the central electrodes. To enhance spatial resolution of an X-ray image, the horizontal cross sectional area of each pixel 16 is also made small with the separation between central electrodes 28 of adjoining pixels being on the order of two millimeters. The resulting configuration forms a rectangular grid of X-ray detecting pixels 16, as shown in FIG. 1.

The array of detector cells comprises a deep diode array inasmuch as the n+ type dopant material diffused to form the wall areas 18 and 20 and the central electrode 28 extend completely through the semiconductor material and terminate in opposed surfaces of the wafer 10. The application of bias potentials across the central electrodes 28 and the grid walls 18 and 20 fully disclosed in the afore-identified U.S. Pat. No. 4,472,728, will create a depletion region (absence of free holes or electrons tending to change electron current) extending laterally from the central electrode to the adjacent wall of each pixel 16 completely through the entire thickness of the wafer. This configuration assures that incident X-rays impinging upon wafer 10 with a penetration depth less than the thickness of the wafer, i.e., energies up to 30 Kev, will precipitate a photoelectron interaction with the wafer material. Regardless of where the interaction occurs within a pixel, the resulting photoelectrons will be attracted to the central electrode 28, thereby providing a basis for detection of the incident X-rays. The central electrode of each pixel may be connected to a separate element of a CCD processor, enabling the processor to sequentially read each pixel and generate a composite image of an observed object as it appears on the illuminated surface of the detector array.

Fabrication of the detector array by the afore-disclosed process is much easier to achieve accurately. Laser drilling easily aligns the walls of the cells and they have little tendency to drift from the vertical axis. Moreover, no transistor action is encountered with the pnn+ arrangement, eliminating bothersome leakage current. An alternative dopant material to form the walls of the cells may be arsenic or bismuth.

Having thus shown and described the invention in specific detail, the same has been provided by way of explanation and not limitation and accordingly all modifications, alterations and changes coming within the spirit and scope of the invention are herein meant to be included.

We claim:

1. A process of fabricating a semiconductor array of detector cells comprising the steps of:
    drilling a plurality of openings in a rectangular configuration completely through a body of semiconductor material to form a grid of discrete openings defining walls of adjoining cells therethrough;
    diffusing a dopant material through said openings; and
    forming within every cell a metal central electrode from the top surface of said semiconductive body to the bottom surface.

2. The process of claim 1 wherein the step of drilling is by a laser.

3. The process of claim 2 wherein said metal to form the central electrode comprises a p-type conductivity metal, and said material diffused through said openings comprises an n+ type conductivity dopant in a concentration greater than the dopant material of said semiconductive body.

4. The process of claim 3 wherein said p-type conductive metal comprises aluminum and said n+ type conductive dopant comprises phosphorus.

5. The process of claim 3 wherein said step of diffusing the dopant through the openings is of sufficient time to ensure that the dopant diffused therethrough contacts dopant diffused through adjacent openings to form continuous walls defining said cells.

6. The process of claim 5 further including the step of providing metallic ohmic contacts between the dopant diffused through the openings on both the top and bottom surfaces of said semiconductive body.

7. The process of claim 6 wherein the step of forming said central electrode comprises a thermal migration process.

8. The process of claim 1 wherein the thickness of said semiconductive body is 50 mils, said central electrodes are separated by 2 mm., and said openings are spaced 2 mils apart.

9. The process of claim 1 further including the step of forming a thin layer of oxide on both top and bottom surfaces of said semiconductor material by passing steam and oxygen over the surfaces while said semiconductor material is maintained at a temperature of 1000° C.

10. The process of claim 1 wherein said central electrodes are located equidistantly from said walls.

* * * * *